(12) United States Patent
Leussler

(10) Patent No.: US 6,650,118 B2
(45) Date of Patent: Nov. 18, 2003

(54) RF COIL SYSTEM FOR AN MR APPARATUS

(75) Inventor: Christoph Guenther Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/194,108

(22) Filed: Jul. 12, 2002

(65) Prior Publication Data

US 2003/0020475 A1 Jan. 30, 2003

(30) Foreign Application Priority Data

Jul. 13, 2001 (DE) .......................... 101 34 171

(51) Int. Cl.⁷ ............................... G01V 3/00
(52) U.S. Cl. ..................... 324/318; 324/322
(58) Field of Search ................ 324/318, 322, 324/300, 306, 307, 309, 312, 314

(56) References Cited

U.S. PATENT DOCUMENTS 6,011,393 A * 1/2000 Kaufman et al. ........... 324/318
6,087,832 A * 7/2000 Doty ......................... 324/318
6,493,572 B1 * 12/2002 Su et al. ..................... 600/422

* cited by examiner

Primary Examiner—Louis Arana
(74) Attorney, Agent, or Firm—Thomas M. Lundin, Esq.

(57) ABSTRACT

The invention relates to an RF coil system for an open MR apparatus. The system includes a plurality of resonator elements which are arranged at the area of a patient (102) positioned in the examination volume of an MR apparatus. The resonator elements are constructed at least partly as solenoid elements (104) whose conductor elements form open turns which are arranged around the patient (102). It is thus achieved that the RF field generated in the transmission mode and the sensitivity profile in the detection mode are limited as strictly as possible to the examination volume of interest. At the same time RF field strengths that are adequate for medical imaging can be generated without exposing the patient to an unacceptable load.

10 Claims, 2 Drawing Sheets

RF COIL SYSTEM FOR AN MR APPARATUS

BACKGROUND

The invention relates to an RF coil system for an open MR apparatus, which system includes a plurality of resonator elements which are arranged at the area of a patient positioned in the examination volume of an MR apparatus, the resonator elements having at least one conductor element and at least one capacitor.

During MR imaging the nuclear magnetization in the examination volume is localized by means of temporally varying, spatially inhomogeneous magnetic fields (magnetic field gradients) which are superposed on a steady, as homogeneous as possible magnetic field. For the formation of images the magnetic resonance signal in the form of a voltage induced in the RF coil system of the MR apparatus is picked up under the influence of a suitable sequence of RF and gradient pulses in the time domain. The actual image reconstruction is then performed by Fourier transformation of the time signals. The sampling of the reciprocal k space is defined by the number, the distance in time, the duration and the strength of the gradient pulses used; this k space defines the volume to be imaged (FOV or field of view) as well as the image resolution. The number of phase encoding steps, and hence the duration of the imaging sequence, is defined by the requirements imposed on the image format and the image resolution. Contemporary MR apparatus aim to form images with an as high as possible quality and in an as short as possible period of time. Consequently, special requirements are imposed on the gradient system and the RF system of the MR apparatus.

In conventional MR apparatus the steady magnetic field, the RF fields and the magnetic field gradients are generated by essentially cylindrical coils which fully enclose the patient to be examined. In most cases cylindrical coil systems are also used for the detection of the MR signals. The RF system of customary MR apparatus includes a transmission and receiving coil such as, for example, an integrated body coil which can be used for volume imaging of the examination volume. The body coils used for the excitation as well as the detection of MR signals customarily are so-called birdcage resonators (birdcage coils). Such coils have a plurality of conductor rods which are arranged around the examination volume and extend parallel to the direction of the main field, said conductor rods being connected to one another via loop conductors at the extremities of the coil. The resonance behavior of the body coil is governed by capacitor elements which interconnect the conductor elements so as to form a network.

The steady magnetic field in a conventional MR system normally extends horizontally and parallel to the longitudinal axis of the cylindrical coil system. Granted, the cylindrical configuration enables high field strengths to be generated with a field distribution that can be suitably controlled. However, such a configuration has the drawback that the access to the examination volume and the patient present therein is strongly impeded. Because of the poor accessibility of the patient, the cylindrical geometry severely impedes or even inhibits interventional examinations. The narrow closed cylindrical tube of the MR apparatus, moreover, often gives rise to claustrophobic reactions of the patient.

For the above reasons so-called open MR apparatus have recently been developed; the examination volume therein is suitably accessible both for the patient and for a physician performing an examination. Some of the open MR apparatus utilize two disc-shaped magnet elements which are arranged at opposite sides of the examination volume and produce a vertically directed, steady magnetic field. The coils for generating the magnetic field gradients and the RF coils in such a system are customarily also constructed so as to be flat and disc-shaped, said coils being integrated in the pole faces of the main field magnet.

The flat construction of the RF coil system in open MR apparatus has the drawback that it is difficult to generate a suitably homogeneous RF field in the examination volume. Particularly strong inhomogeneities occur in the vicinity of the pole faces in which the conductor elements of the RF coils are integrated. The same holds for the sensitivity during the detection of the MR signals as this sensitivity disadvantageously also strongly dependent on the distance from the pole faces of the magnet in the open systems. A further problem resides in the fact, unlike in the conventional systems, no RF shielding is provided laterally around the examination volume in open MR apparatus. Therefore, the RF field strength decreases only slowly outside the examination volume and the spatial sensitivity profile during the detection also extends into areas far outside the examination volume. Consequently, outside the region of interest there are generated MR signals which, because of aliasing effects, become visible as undesirable artifacts in the selected FOV of the image formed.

Furthermore, flat RF coils in open MR apparatus are substantially more ineffective for the generating of RF fields than cylindrical coils. Therefore, open systems require a significantly higher transmission power in comparison with the conventional closed systems. Apart from the fact that stronger and hence more expensive power amplifiers are required, the level of the specific RF load whereto the patient to be examined is exposed is significantly higher than in customary MR apparatus. Because the conductor elements of the coil system at the area of the pole faces of the magnet are arranged very near to the body of the patient, the high RF field strengths may cause hazardous injuries (burnings) due to the absorption of the field energy in the body tissue. In order to avoid such risks, the transmission power must be limited in open MR systems. However, such limiting has an adverse effect on the imaging quality.

An alternative for the RF coils integrated in the pole faces of the main field magnet is the use of surface coils or systems with several surface coils, for example, as known from WO 99/27381. In conformity with the cited document, a plurality of surface coils, arranged notably at the area of the extremities of the patient to be examined, can operate in parallel in order to combine the respective detected MR signals so as to form an overall image. It is particularly advantageous that the limited spatial sensitivity range of the surface coils yields a larger signal-to-noise ratio. The combining of several surface coils for imaging is also known as SYNERGY.

However, the known arrangements of surface coils cannot be simply used in open MR apparatus. On the one hand, it should be noted that the orientation of the surface coils relative to the steady magnetic field has a decisive effect on the sensitivity upon detection. As has already been stated, the steady magnetic field is directed vertically in open MR systems. In this case surface coils which are arranged in a flat position on or underneath the patient have a minimum sensitivity only, because the nuclear magnetization which performs a precessional motion perpendicularly to the steady magnetic induces practically no voltage in such a coil system. However, surface coils which have each time a vertically oriented coil plane and are arranged to the side of the patient will be suitable. Unfortunately, however, it is a drawback that the sensitivity of surface coils decreases strongly in the direction from the coil plane to the volume to be examined. The high sensitivity inside the coil is not used.

Birdcage coils which are arranged around the patient are not suitable either for open MR apparatus. This is because these coils produce a circularly polarized RF field in a vertical plane. Because of the vertically oriented steady magnetic field, however, a horizontally oriented RF field which extends perpendicularly thereto is required.

SUMMARY

Considering the foregoing, the present invention has for its object to provide an RF coil system for open MR apparatus in which the RF field generated in the transmission mode and the spatial sensitivity profile in the detection mode are limited as much as possible to the examination volume of interest. A high sensitivity should be obtained in the detection mode and it should notably be possible to generate the RF field strengths which satisfy the imaging requirements while the load whereto the patient is exposed should remain acceptable nevertheless.

This object is achieved in accordance with the invention in an RF coil system of the kind set forth in that at least one of the resonator elements is a solenoid element whose conductor element forms at least one open turn which is arranged around the patient.

Constructing one or more of the resonator elements as turns arranged around the patient in accordance with the invention offers a number of advantages. On the one hand, such solenoid elements generate a horizontally oriented, linearly polarized RF field which, because of the vertical direction of the main field, is well suitable for the excitation of MR signals in the examination volume of an open MR system. Therefore, a suitable sensitivity is also obtained in the detection mode. It is also feasible to arrange a plurality of solenoid elements around the patient so that they extend at an angle relative to one another, thus enabling operation in the quadrature mode. On the other hand, it is also advantageous that the patient is situated within the solenoid elements in the arrangement in accordance with the invention, that is, at the area where the RF field or the sensitivity profile is homogeneous to a high degree.

Unlike the flat RF coils integrated in the pole faces of the magnet, the solenoid elements have a spatial sensitivity profile which is more or less strictly limited to the area of the patient to be examined. Arranging the turns of the solenoid elements so as to extend at a short distance from and around the patient has a positive effect on the signal-to-noise ratio. Moreover, only comparatively small transmission powers are required for the excitation of MR signals.

It is advantageously possible to associate separate receiving channels with the individual resonator elements of the coil system in accordance with the invention, the detected MR signals then being applied, via said separate receiving channels, to a receiving unit for further processing. On the one hand volume imaging can thus be carried out with an as large as possible FOV by combining the MR signals detected by means of the individual resonator elements. Alternatively, sub-images can be formed from the separately detected MR signals, which sub-images are subsequently combined so as to form an overall image. This may be advantageous on the one hand to improve the signal-to-noise ratio, the individual resonator elements then being used as synergy coils. It is also possible to combine the individual images on the basis of the spatial sensitivity profiles associated with the individual resonator elements, thus saving measuring time during the imaging (SENSE method, sensitivity encoding). It is advantageous that the suitably defined spatial sensitivity profiles of the solenoid elements can be utilized for this purpose.

In the RF coil system in accordance with the invention it is advantageous to orient the plane of at least one solenoid element so as to extend perpendicularly to the longitudinal axis of the patient in conformity with claim 2. This enables the turns of the relevant solenoid elements to be arranged as closely as possible around the patient, resulting in a maximum sensitivity and an optimum signal-to-noise ratio. Notably an advantageous embodiment of the coil system claimed in claim 3 can thus be implemented; this embodiment a plurality of solenoid elements with a variable dimension of the turns can be arranged axially one behind the other. A parallel imaging method enables a large FOV to be covered in that the relevant regions of interest of the patient are enclosed by individual solenoid elements. The size of the turns is then adapted to the posture of the patient in that each turn is arranged closely around the patient. The sensitive area is thus strictly limited to the regions of interest; this has a favorable effect on the image quality.

An advantageous further embodiment of the coil system in accordance with the invention is obtained in conformity with claim 4 in that at least one of the resonator elements is a surface coil which is oriented in such a manner that the RF magnetic field generated by the surface coil has a component which extends perpendicularly to the longitudinal axis of the patient. The combination of solenoid elements around the patient and additional surface coils enables a further improvement of the receiving quality (improved signal-to-noise ratio, higher resolution) to be achieved. Considering the foregoing, for optimum sensitivity it is necessary to orient the surface coil in an open MR apparatus in such a manner that the nuclear magnetization which precesses in the horizontal plane induces a detectable voltage. It is notably when the plane of the surface coil used extends perpendicularly to the solenoid elements that the spatial sensitivity profiles of the relevant resonator elements strongly deviate from one another; this is advantageous for image reconstruction by means of the SENSE method. For example, it is feasible to arrange surface coils, together with solenoid elements, on a common cylinder surface which encloses the patient. Depending on the position relative to the main magnetic field, the surface coils are constructed as ring coils or as so-called butterfly coils. This enables the formation of systems which are all optimally suited for the imaging of the head or the body or notably for the imaging of the head/neck region.

For parallel imaging methods the individual resonator elements of the RF coil system in accordance with the invention should be decoupled from one another. In conformity with claim 5 such decoupling can be particularly simply realized by means of capacitances or inductances arranged between the conductor elements. When the capacitance or inductance values are suitably chosen, it is ensured that no resonant coupling exists between the various resonator elements. It may then make sense to provide decoupling networks (consisting of capacitances and inductances) between the conductor elements of neighboring resonator elements as well as of more remote resonator elements.

The coil system in accordance with the invention can be employed in an open MR apparatus as claimed in the claims 6 and 7. For the execution of parallel imaging methods (SYNERGY, SENSE) a separate receiving channel of the receiving unit is then advantageously associated with each resonator element.

An advantageous further embodiment of such an MR apparatus is obtained in conformity with claim 8 in that a separate transmission channel of a transmission unit is associated with each resonator element, the phase and/or the amplitude of the RF power supply being individually selectable for each resonator element by means of the transmission unit.

Because a separate transmission channel is associated with each resonator element in the open MR apparatus in accordance with the invention, the field distribution in the examination volume can be advantageously controlled completely. This is because any imaginable current distribution can be realized in the arrangement of the conductor elements by selecting the amplitude and phase for the individual transmission channels. The variation in time of the RF supply can also be selected so as to be different for each individual transmission channel. The amplitude and the phase of each individual transmission channel can be controlled by the software of the MR apparatus, thus enabling direct interactive control of the field distribution (RF shimming). For example, it is possible to integrate fully automatic control of the RF field homogeneity in the examination volume in the imaging sequence so as to compensate variable effects on the field distribution, for example, effects which are due to the different dielectric properties of the patients to be examined.

Because the spatial distribution of the RF field in the examination volume can be chosen at random, a series of further fields of application becomes feasible. For example, gradients in the RF field can be generated in different directions in space. The selection of spatially and temporally variable RF field patterns enables location codes to be impressed on the excited nuclear magnetization distribution; such codes can be used for fast volume imaging (Transmit SENSE method). It is also feasible to carry out a spatially selective pre-saturation of the nuclear magnetization in the examination volume.

A particularly simple implementation is obtained in conformity with claim 9 in which each transmission channel is connected to an output of a connection network (combiner hybrid) associated with the relevant resonator element, which connection network distributes the power of a transmission amplifier among the individual resonator elements. The connection network then defines the phase and the amplitude of the relevant supplied RF signal for each resonator element. This embodiment offers the advantage that the RF supply requires only a single power transmitter whose output is distributed among the individual resonator elements by means of the combiner hybrid. The distribution advantageously takes place in such a manner that an as homogeneous as possible RF field distribution is produced in the examination volume.

DRAWINGS

Embodiments of the invention will be described in detail hereinafter with reference to the Figures. Therein:

DESCRIPTION

Figure 1:
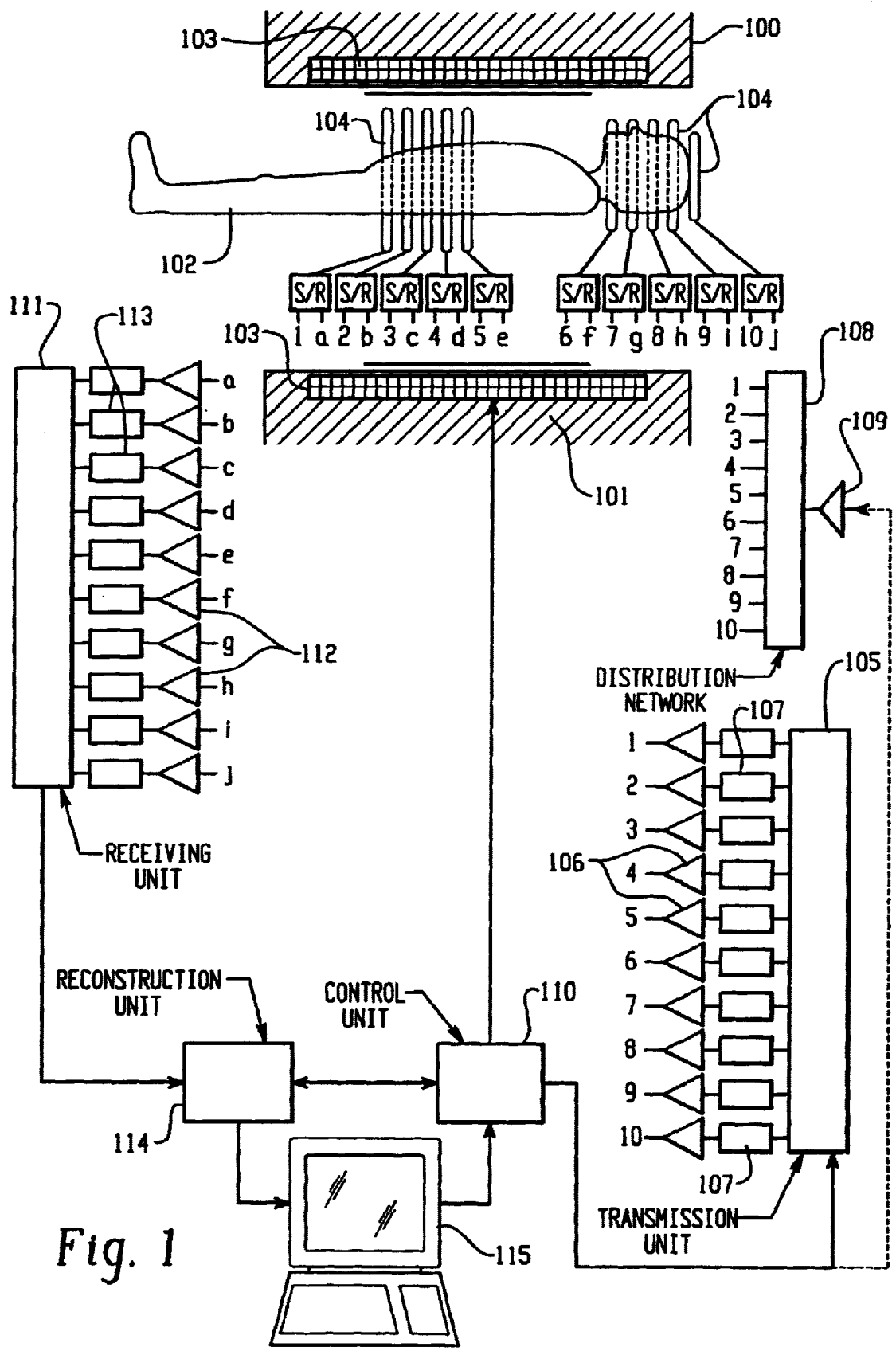
FIG. 1 shows an MR apparatus provided with an RF coil system in accordance with the invention.

At the center of the MR apparatus shown in FIG. 1 there is provided an open magnet with an upper pole disc 100 and a lower pole disc 101. Between the pole discs 100 and 101 there is situated the examination volume in which a patient 102 is arranged on a patient table (not shown). A vertically oriented, steady magnetic field of a strength of, for example, 0.7 Tesla is generated at the area of the examination volume. For MR imaging, moreover, temporally varying magnetic field gradients must be generated in the examination volume. A plurality of gradient coils 103 which are integrated in the pole discs 100, 101 of the open magnet are provided for this purpose. The RF fields which are also required for MR imaging are generated by means of a system of RF coils which includes ten solenoid elements 104 in conformity with the invention whose conductor elements form open turns which are arranged around the patient. Capacitors (not shown) which define the resonance behavior of the arrangement are integrated in the solenoid elements 104. FIG. 1 shows two groups of solenoid elements. Five turns of an appropriate size are arranged around the thorax of the patient 102. The turns arranged around the head of the patient are smaller in conformity with the smaller dimensions of the head. A particularly small turn is used at the area of the cranium of the patient 102. The coil system shown serves not only for the excitation of MR signals in the examination volume but also for the detection thereof. Each of the ten solenoid elements 104 shown in FIG. 1 is connected to a switch S/R whereby the relevant resonator element 104 is connected to one of two possible terminals, that is, in dependence on the mode of operation. The terminals intended for the transmission mode are denoted by the numerals 1 to 10 while the terminals intended for the receiving mode are denoted by the letters a to j. The terminals 1 to 10 are associated with the correspondingly denoted outputs of a transmission unit 105. The transmission unit includes a respective transmission channel for each individual resonator element of the coil system, said transmission channel having a respective power amplifier 106 as well as an RF control unit 107. The RF control unit 107 enables adjustment of the amplitude and the phase of the RF signal for each individual transmission channel, so that practically any arbitrary RF field distribution can be realized in the examination volume of the MR apparatus. It is also possible to use a less intricate alternative in the form of a distribution network 108 (combiner hybrid) which distributes the output signal of an RF transmission amplifier 109 among the terminals 1 to 10 and defines the amplitude and phase of the RF signal for each output channel 1 to 10. In order to generate RF pulses in the examination volume, the transmission unit 105 or the transmission amplifier 109 is connected to a control unit 110. In order to control the succession in time of the gradient pulses, moreover, the control unit 110 is connected to the gradient coil system 103. The terminals a to j, being intended for the receiving mode are associated with the receiving channels of a receiving unit 111 which are denoted by corresponding letters. Each receiving channel is provided with a sensitive RF preamplifier 112 as well as with a demodulator 113. The MR signals received by the receiving unit 111 are transferred to a reconstruction unit 114 in which the digitized signals are combined and Fourier analyzed. The images formed by means of the reconstruction unit 114 are output via the monitor of a microcomputer 115. The microcomputer 115 at the same time serves for control of the MR apparatus by a user; to this end, the computer 115 is also connected to the control unit 110.

Figure 2:
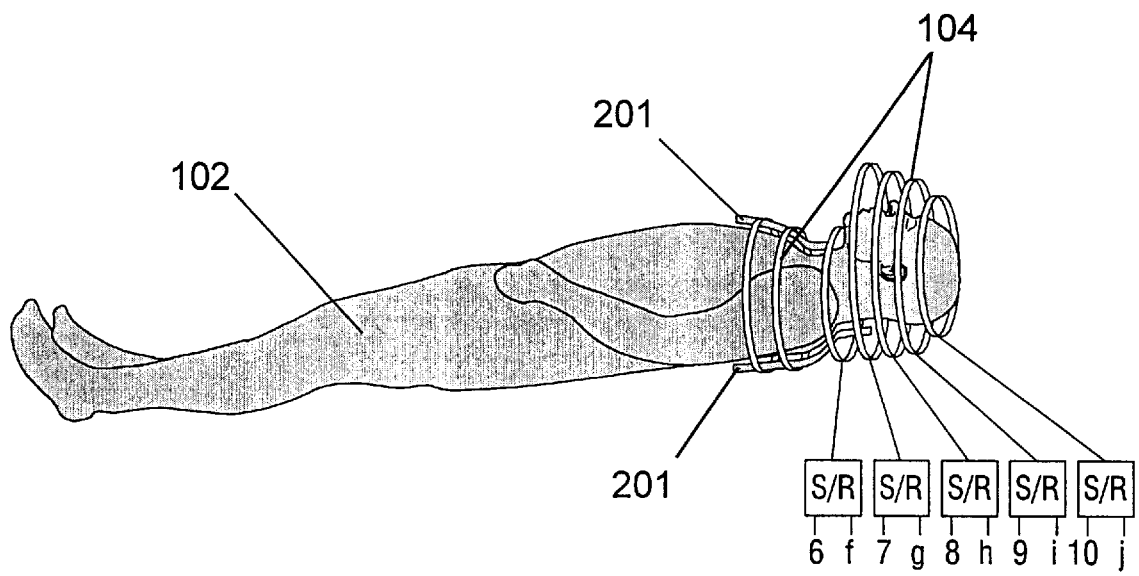
FIG. 2 shows a coil system in accordance with the invention for head/neck imaging.

FIG. 2 shows an arrangement of solenoid elements 104 which is arranged around the patient 102 and is optimized for head/neck imaging. The dimensions of the turns 104 are adapted each time to the dimensions of the head, the neck and the shoulders of the patient, thus enabling the sensitive volume of the arrangement to be limited as strictly as possible to the regions of interest of the patient 102 to be examined. The turns are supported on the body of the patient 102 by a holding device 201. Because the individual solenoid elements 104 are connected to separate receiving channels f to j, the combining of the respective detected MR signals enables complete volume imaging of the head/neck/ shoulder region to be carried out.

Figure 3:
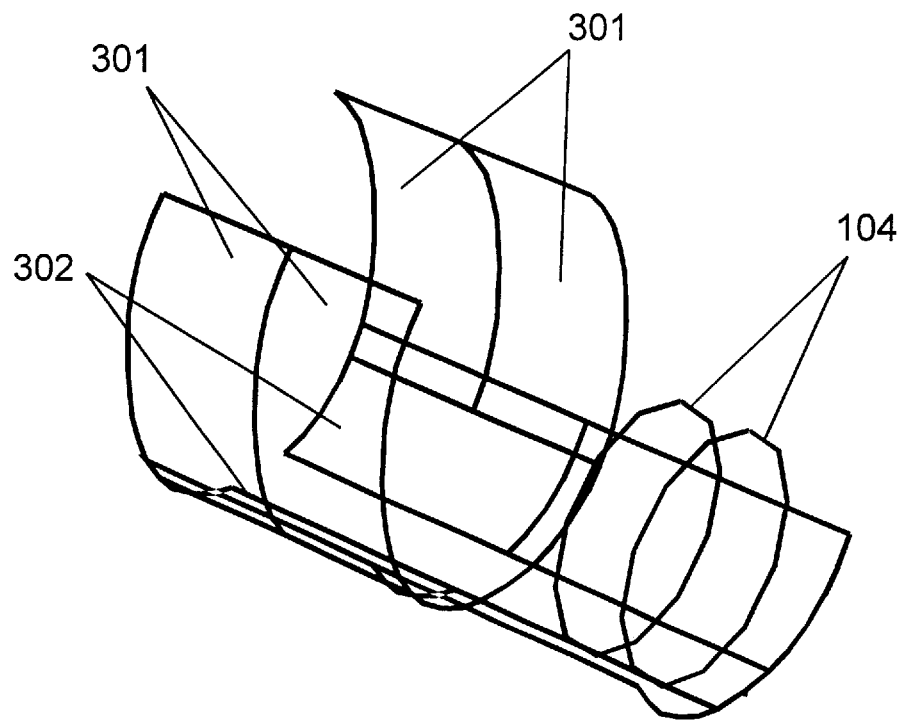
FIG. 3 shows an alternative embodiment of a head/neck coil system.

FIG. 3 shows an alternative coil system for head/neck imaging. In addition to the solenoid elements 104 which are arranged around the neck of the patient (not shown in this case), the coil system includes surface coils 301 which are arranged at the side of the head and generate an RF field which contains horizontally oriented components which, therefore, extend perpendicularly to the main field of the open MR apparatus. At the area of the neck this coil system comprises surface coils 302 which are connected together as butterfly coils and hence co-operate so as to generate a field which is also directed essentially horizontally. The coil system shown is adapted to the anatomy of the patient, thus enabling imaging of the head/neck region with a high resolution and a large signal-to-noise ratio in open MR systems. As far as its use is concerned, such an arrangement corresponds to the head coils in conventional MR apparatus in which it is usually constructed in the form of birdcage coils.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. An RF coil system which is intended notably for an open MR apparatus and includes a plurality of resonator elements which are arranged at the area of a patient positioned in the examination volume of an MR apparatus, the resonator elements comprising at least one conductor element and at least one capacitor, wherein at least one of the resonator elements is a solenoid element whose conductor element forms at least one open turn which is arranged around the patient.

2. An RF coil system as claimed in claim 1, wherein at least one solenoid element is oriented perpendicularly to the longitudinal axis of the patient.

3. An RF coil system as claimed in claim 1, wherein the RF coil system includes a plurality of solenoid elements which are arranged axially one behind the other and have variable turn dimensions, and the solenoid elements comprise means to adapt the turn dimensions to the dimensions of the patient to be examined.

4. An RF coil system as claimed in claim 1, wherein at least one of the resonator elements is a surface coil which is oriented in such a manner that the RF magnetic field generated by the surface coil contains a component which extends perpendicularly to the longitudinal axis of the patient.

5. An RF coil system as claimed in claim 1, wherein the resonator elements are pair-wise connected to one another via decoupling elements.

6. An MR apparatus comprising:
    an open main field magnet which generates an essentially vertically directed, steady magnetic field in an examination volume;
    a gradient coil system;
    an RF coil system comprising:
        a plurality of resonator elements which are arranged at the area of a patient positioned in the examination volume of an MR apparatus, the resonator elements comprising at least one conductor element and at least one capacitor, wherein at least one of the resonator elements is a solenoid element whose conductor element forms at least one open turn which is arranged around the patient; and
    a receiving unit which is connected to the RF coil system.

7. An MR apparatus as claimed in claim 6 wherein the receiving unit comprises a plurality of receiving channels and each resonator element is associated with a separate receiving channel.

8. An MR apparatus as claimed in claim 7, further comprising a plurality of solenoid elements which are arranged axially one behind the other and are oriented perpendicularly to the longitudinal axis of the patient, the dimensions of their turns being at least partly different.

9. An MR apparatus as claimed in claim 6, wherein a separate transmission channel of a transmission unit is associated with each resonator element, the phase and/or the amplitude of the RF supply being individually selectable for each resonator element by means of the transmission unit.

10. An MR apparatus as claimed in claim 9, wherein the transmission unit includes a network circuit which distributes the power of a transmission amplifier among the individual resonator elements, the network circuit defining the phase and the amplitude of the respective supplied RF signal for each resonator element.

* * * * *